United States Patent [19]

Uchidoi et al.

[11] 4,268,653

[45] May 19, 1981

[54] PROCESS FOR PREPARATION OF A POLYMERIC PIEZO-ELECTRIC MATERIAL AND MATERIAL PREPARED BY SAID PROCESS

[75] Inventors: Masataka Uchidoi; Kiyonori Iwama; Tsutomu Iwamoto, all of Tokorozawa; Junichi Sako, Suita; Yoshihide Higashihata, Settsu, all of Japan

[73] Assignees: Pioneer Electronic Corporation, Tokyo; Daikin Kogyo Co., Ltd., Osaka, both of Japan

[21] Appl. No.: 133,996

[22] Filed: Mar. 26, 1980

[30] Foreign Application Priority Data

Mar. 26, 1979 [JP] Japan .................................. 54-34236
Mar. 26, 1979 [JP] Japan .................................. 54-34237
Mar. 26, 1979 [JP] Japan .................................. 54-34238

[51] Int. Cl.³ ...................... B29C 25/00; H01L 41/00
[52] U.S. Cl. .................................. 526/255; 179/111 E; 264/22; 307/400; 310/800; 428/421; 526/242; 526/250
[58] Field of Search ................. 264/22; 526/250, 255; 428/421; 179/110 A, 111 E; 307/400; 310/800; 427/100

[56] References Cited

U.S. PATENT DOCUMENTS

| 3,793,715 | 2/1974 | Murayama et al. | ................ 307/400 |
| 3,878,274 | 4/1975 | Murayama et al. | ................ 264/22 |
| 4,173,033 | 10/1979 | Sako et al. | .............. 526/255 |

FOREIGN PATENT DOCUMENTS 2738220  3/1978  Fed. Rep. of Germany ...... 310/800

*Primary Examiner*—James B. Lowe
*Attorney, Agent, or Firm*—Sughrue, Rothwell, Mion, Zinn and Macpeak

[57] ABSTRACT

A process for preparation of a polymeric piezo-electric material and material prepared by said process are described, wherein said process comprises polarizing a polymeric piezo-electric material by a polarization treatment which comprises cooling a vinylidene fluoride-trifluoroethylene copolymer from a temperature higher than the phase transition temperature of said copolymer which exists between room temperature and the melting point of said copolymer, and either maintaining the temperature range at which said copolymer possesses a maximum in dielectric constant occurs, or cooling gradually through said temperature range, while applying an electric field at least within said temperature range.

10 Claims, 4 Drawing Figures

PROCESS FOR PREPARATION OF A POLYMERIC PIEZO-ELECTRIC MATERIAL AND MATERIAL PREPARED BY SAID PROCESS

BACKGROUND OF THE INVENTION

1. Field of the Invention

The present invention relates to a process for preparing a polymeric piezo-electric material composed of a vinylidene fluoride-trifluoroethylene copolymer having an increased piezo-electric constant.

The present invention also relates to a polymeric piezo-electric material, capable of use as a temperature sensor, in which the polarity of the piezo-electric modulus is reversed at a specific temperature.

The present invention further relates to a polymeric piezo-electric material in which the polarity of the piezo-electric constant in the stretching direction and in a direction orthogonal to the stretching direction are opposite to each other.

2. Discussion of the Prior Art

Hitherto, polyvinylidene fluoride has been studied extensively as a polymeric piezo-electric material. A known process for preparing such a material comprises a polarization treatment including applying a high electric field at about 100° C. and then cooling gradually to attain a high piezo-electric constant. However, in the case of a vinylidene fluoride-trifluoroethylene copolymer, a polymeric piezo-electric material having a high piezo-electric constant can not be obtained by the above-described process.

In prior polymeric piezo-electric materials, the polarity of the piezo-electric constant in a stretching direction has been the same as in the orthogonal direction.

SUMMARY OF THE INVENTION

Accordingly, an object of the present invention is to provide a process for preparing a polymeric piezo-electric material of a vinylidene fluoride-trifluoroethylene copolymer having high piezo-electric constant by a polarization treatment.

Another object of the present invention is to provide a polymeric piezo-electric material, capable of use as a temperature sensor in addition to its use as a piezo-electric material, which is obtained by a polarization treatment of a vinylidene fluoride-trifluoroethylene polymer under such a condition that the polarity of the piezo-electric constant is reversibly reversed at a specific temperature lower than the melting point of the copolymer.

A further object of the present invention is to provide a polymeric piezo-electric material which comprises a vinylidene fluoride-trifluoroethylene copolymer having a high piezo-electric constant, the polarity of which in the stretching direction is opposite to that in the orthogonal direction, and has a large piezo-electric constant at stretching ratio wherein the polarity of the piezo-electric constant is reversed.

DETAILED DESCRIPTION OF THE INVENTION

Figure 1:
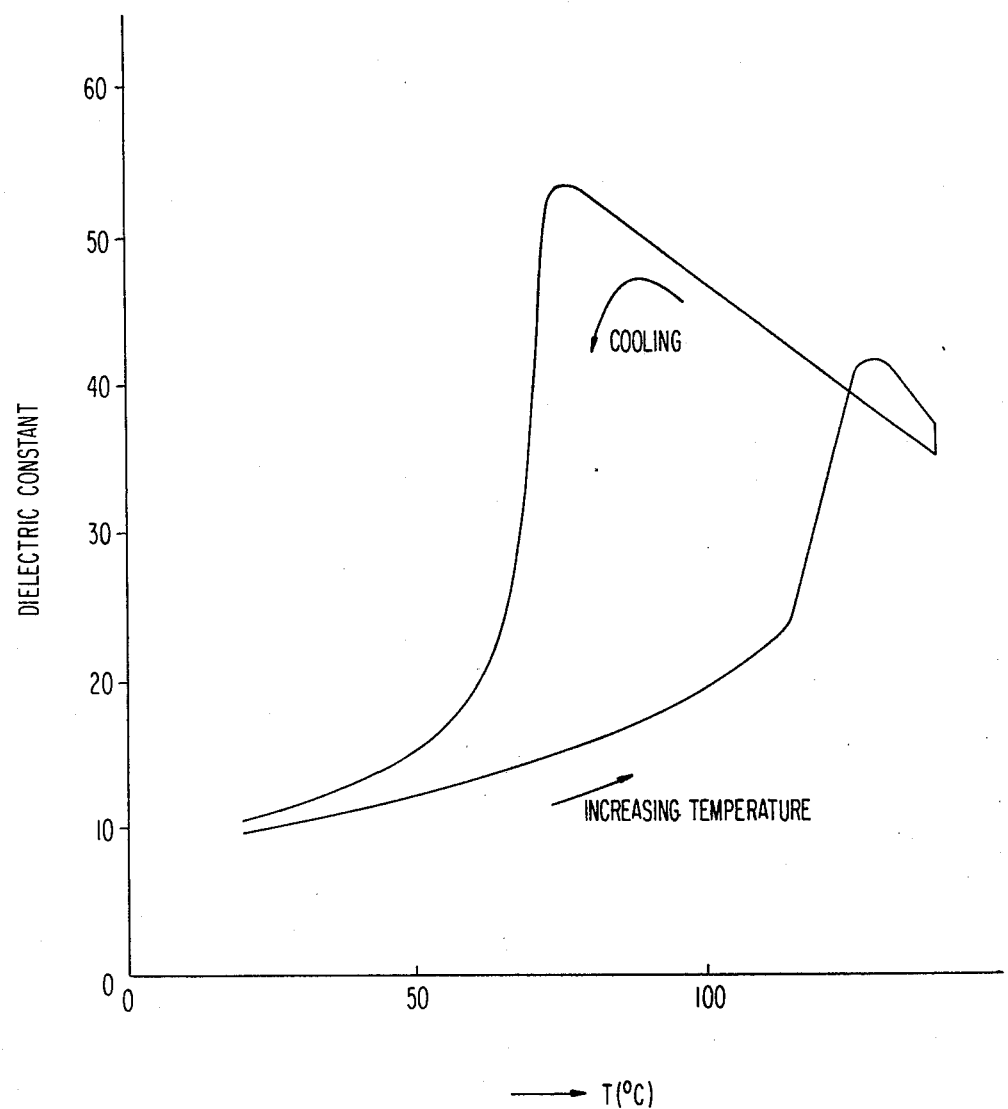
FIG. 1 is a graph which shows the relation between the dielectric constant during cooling and the temperature in the process for polarization treatment of a polymeric piezo-electric material of the present invention.

In the following description, the process for preparing polymeric piezo-electric material by a polarization treatment according to the present invention is particularly illustrated with reference to the graph shown in FIG. 1.

The copolymerization ratio of vinylidene fluoride in the copolymer used in the present invention ranges from 45 mol% to 90 mol%, and is preferably from 45 mol% to 65 mol%.

The dielectric constant of the vinylidene fluoride-trifluoroethylene copolymer varies from increasing to decreasing temperature. The maximum of the dielectric constant during cooling will vary depending on the conditions of the prior heat treatment. The polarization treatment of the present invention comprises cooling a vinylidene fluoride-trifluoroethylene copolymer from a temperature higher than the phase transition temperature of said copolymer which exists between room temperature and the melting point of said copolymer and either maintaining the temperature within the temperature range such that the maximum of the dielectric constant appears at least for about 10 minutes and preferably for 30 minutes or more, or cooling gradually through this temperature range, preferably at cooling rate of several °C./min (e.g., 1° C./min), and optionally the rate of cooling is accelerated below the temperature of maximum dielectric constant and is preferably 40° to 50° C./min at the earlier stage and 10° to 20° C./min at the later stage. The temperature range is from 20° C. lower than the temperature at which the maximum of the dielectric constant occurs to 10° C. higher than the temperature, preferably the range of ±10° C. from the temperature. It is noted that the phase transition temperature and the melting point of the copolymer vary depending upon the copolymerization ratio of the copolymer and are within the ranges of from 55° to 130° C. and from 150° to 180° C., respectively. The electric field is applied to the copolymer at least within the temperature range where a maximum dielectric constant occurs. The electric field applied is generally in the range of from about 100 to 600 KV/cm and is preferably at a voltage less than, but close to the break down voltage of the copolymers.

The voltage of the electric field applied can be changed during the polarization treatment provided that the voltage does not exceed the break down voltage of the copolymer, which varies depending upon the temperature of the copolymer.

It is noted that a higher piezo-electric constant is obtained as a stronger electric field is applied and that the break down voltage decreases as the temperature increases; that is, in order to attain a high piezo-electric constant, a strong electric field is preferred, with the proviso that the the voltage of electric field does not exceed the break down voltage at the temperature of the copolymer.

In the following Examples 1-6, the copolymer used comprised 72 mol% vinylidene fluoride (phase transition temperature: about 118° C.). A voltage of 200 KV/cm was applied from the beginning at room temperature throughout the polarization treatment and the time for maintaining the copolymer at the polarization temperature was 40 minutes.

| Example | Polarization temperature °C. | Temperature to which copolymer is gradually cooled °C. | Cooling condition after cooling gradually to maximum of dielectric constant | Temperature and maximum value of specific dielectric constant during cooling | | Piezo-electric constant at 25° C. |
|---|---|---|---|---|---|---|
| | | | | °C. | $\epsilon'$ | cgs esu |
| 1 | 80 | 35 | Cooling gradually | 65 | 15 | $0.82 \times 10^{-7}$ |
| 2 | 120 | 35 | Cooling gradually | 85 | 26 | $1.48 \times 10^{-7}$ |
| 3 | 120 | 75 | Acceleration of cooling | 85 | 26 | $2.08 \times 10^{-7}$ |
| 4 | 120 | 100 | Cooling rapidly | 85 | 26 | $1.74 \times 10^{-7}$ |
| 5 | 120 | 75 | Cooling rapidly | 85 | 26 | $3.17 \times 10^{-7}$ |
| 6 | 140 | 75 | Acceleration of cooling | 75 | 54 | $2.64 \times 10^{-7}$ |

As illustrated in the foregoing Examples 1-6, according to the present invention it is possible to obtain a polymeric piezo-electric material having a high piezo-electric constant by a polarization treatment of a vinylidene fluoride-trifluoroethylene copolymer which comprises maintaining the copolymer at a temperature range where a maximum of dielectric constant occurs, or cooling gradually through said temperature range, after initially raising the temperature higher than the phase transition temperature of said copolymer which exists between room temperature and the melting point of said copolymer.

In illustrating another embodiment of the present invention, the vinylidene fluoride-trifluoroethylene copolymer is first heat molded, and then subjected to a polarization treatment at a temperature (e.g., 60° to 140° C.) slightly higher than the phase transition temperature of the copolymer, by which the polarity of the piezo-electric constant of the polymeric piezo-electric material is reversibly reversed at a specific temperature lower than the melting point.

EXAMPLE 7

A film prepared by molding a copolymer consisting of 51 mol% vinylidene fluoride and 49 mol% trifluoroethylene at 300° C. was stretched to 3 times its original length (to obtain a thickness of 10-30μ), and it was then fitted with electrodes by vacuum evaporation. When the polarization treatment was carried out at 80° C. for 1 hour under the condition of 400 KV/cm, a polymeric piezo-electric material having a piezo-electric constant of $5.5 \times 10^{-7}$ (cgs esu: 25° C.) was obtained. This material was cut in 5 mm width and a 30-50 mm length and the piezo-electric constant was determined at a frequency of 110 Hz. When the ambient temperature was raised (rate: 1° C./min-3° C./min.), the polarity of the piezo-electric constant was reversed at 130° C.

EXAMPLE 8

A polymeric piezo-electric material having a piezo-electric modulus of $6.5 \times 10^{-7}$ (cgs esu: 25° C.) was obtained by the same conditions of treatment as in Example 7, except that it was stretched to 3.7 times its original length. When the temperature was raised under the same conditions as in Example 7, the polarity of the piezo-electric constant was reversed at 105° C.

EXAMPLE 9

A film obtained by solvent casting method from a copolymer having the same composition as in Example 7, using a solution in methyl ethyl ketone, was stretched to 6 times its original length (thickness: 5-13μ) and fitted with electrodes by vacuum evaporation. When a polarization treatment was carried out at 80° C. for 1 hour at 400 KV/cm, a polymeric piezo-electric material having a piezo-electric constant $5.9 \times 10^{-7}$ (cgs esu: 25° C.) was obtained. When the temperature of this material was raised under the same conditions as in Example 7, the polarity of the piezo-electric constant reversed at 80° C.

EXAMPLE 10

An unstretched film (thickness: 40μ) obtained by molding a vinylidene fluoride-trifluoroethylene copolymer containing 72 mol% vinylidene fluoride at 300° C. was fitted with electrodes by vacuum evaporation. When the polarization treatment was carried out at 140° C. for 1 hour at 200 KV/cm, a polymeric piezo-electric material having a piezo-electric constant of $2.1 \times 10^{-7}$ (cgs esu: 25° C.) was obtained. This material was cut in a 5 mm width and a 30-50 mm length, and the piezo-electric constant was measured at the frequency of 110 Hz. When the ambient temperature was raised (1° C./min-3° C./min), the polarity of the piezo-electric constant reversed at 130° C.

Figure 2:
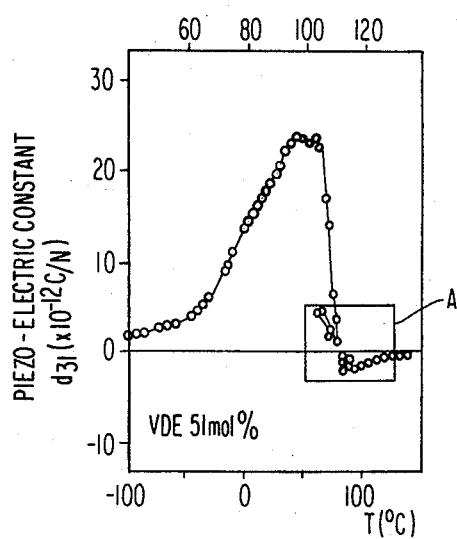
FIG. 2 is a graph which shows the variation of the piezo-electric constant with temperature for a polymeric piezo-electric material according to another embodiment of the present invention.
Figure 3:
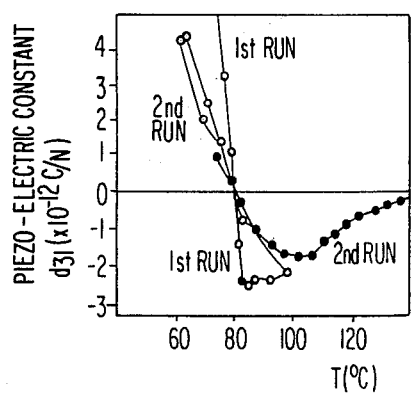
FIG. 3 is an enlargement of the region (A) in FIG. 2, particularly showing the reversal state of the piezo-electric constant.

Results of the measurement in Example 9 are shown in FIGS. 2 and 3. As can be understood from these graphs, when the temperature was raised, the piezo-electric constant rapidly was decreased beginning at about 60° C., and changed to a negative value at about 80° C. When the temperature is then reduced, the piezo-electric constant increases and changes into a positive value at 80° C. (FIG. 3). Black dots in the drawings show the variation of the piezo-electric constant in case of continuing to raise of the temperature.

As shown by preceding Examples 7-10 according to the present invention, the vinylidene fluoride-trifluoroethylene copolymer can be used not only as a piezo-electric material but also as a temperature sensor, when it is subjected to the polarization treatment, because the polarity of piezo-electric constant changes at a specific temperature lower than the melting point thereof. Further, since the temperature at which the polarity is reversed can be controlled by changing the conditions of treatment, not only can sensors having various polarity reversal temperatures be produced but also materials having various desired high piezo-electric constants can be obtained according to the present invention.

Figure 4:
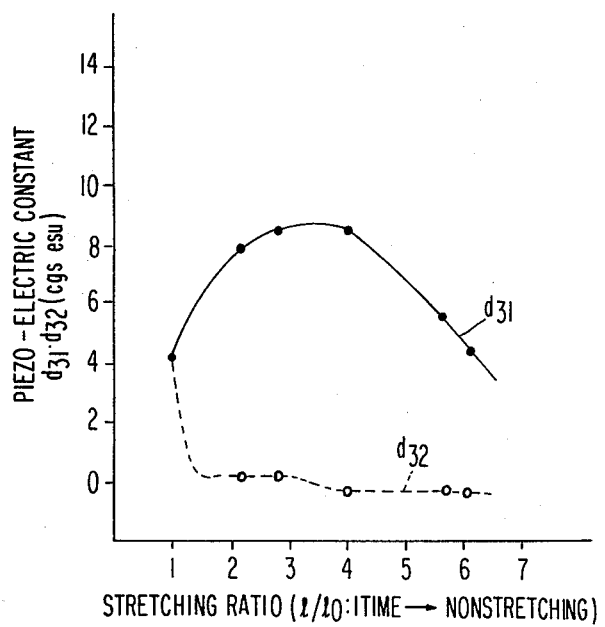
FIG. 4 is a graph which shows the variation of the piezo-electric constant with respect to the stretching ratio for a polymeric piezo-electric material according to the present invention.

The present invention is further illustrated by the following Example 11 and FIG. 4.

EXAMPLE 11

A trifluoroethylene-vinylidene fluoride copolymer containing 51 mol% vinylidene fluoride was molded to form a film by a hot press. The film was stretched for 2 times to 6 times its original length as the stretching temperature was varied from 20° C. to 60° C., to obtain a stretched film having a thickness of 10–50μ. The film was deposited with aluminum by vacuum evaporation. After subjecting it to the polarization treatment at 80° C. for 1 hour at 200 KV/cm, the film was allowed to stand for 24 hours. The resulting polymeric piezo-electric material was then cut in the stretching direction and the orthoganol direction to obtain a sample having a 5 mm width and a 30–50 mm length. As is illustrated in FIG. 4, when the piezo-electric constant was measured at 25° C. and 110 Hz, the polarity of the piezo-electric constant $d_{32}$ in the direction orthogonal to the stretching direction was reversed at the stretching ratio of about 4, and the piezo-electric constant $d_{31}$ in the stretching direction shows a maximum value at a stretching ratio of about 4.

When the polymeric piezo-electric material as described herein is used as a sensor, two kinds of input can be discriminated by a single sensor, because the polarity in the stretching direction is opposite to that in the orthogonal direction.

Therefore according to the present invention, as described above, it is possible to obtain a polymeric piezo-electric material in which the polarity of the piezo-electric constant in the stretching direction is opposite to that in the orthogonal direction, by carrying out polarization after stretching of the vinylidene fluoride-trifluoroethylene copolymer at the stretching ratio of at least about 4, preferably 4 to 6 as described. Furthermore, it is possible to obtain a high piezo-electric constant $d_{31}$ in the vicinity of the stretching ratio at which the piezo-electric constant $d_{32}$ is reversed of its polarity.

While the invention has been described in detail and with reference to specific embodiments thereof, it will be apparent to one skilled in the art that various changes and modifications can be made therein without departing from the spirit and scope thereof.

What is claimed is:

1. A process for preparing a polymeric piezo-electric material by a polarization treatment which comprises
cooling a vinylidene fluoride-trifluoroethylene copolymer from a temperature higher than the phase transition temperature of said copolymer which exists between room temperature and the melting point of said copolymer and either maintaining the temperature within the temperature range where a maximum of dielectric constant occurs, or cooling gradually through said temperature range, while applying an electric field at least within said temperature range.

2. A process for preparing a polymeric piezo-electric material according to claim 1 which comprises applying electric field of from about 100 to 600 KV/cm, at a temperature range at least as high as the temperature range at which a maximum of dielectric constant occurs.

3. A process for preparing a polymeric piezo-electric material according to claim 1 which comprises increasing the cooling rate after the temperature decreases below the temperature range at which a maximum of dielectric constant occurs.

4. A high molecular weight piezo-electric material obtained by a process which comprises polarizing a vinylidene fluoride-trifluoroethylene copolymer under such a condition that the polarity of the piezo-electric constant thereof is reversibly reversed at a specific temperature lower than the melting point of said copolymer.

5. A polymeric piezo-electric material obtained by a process which comprises polarizing after stretching a vinylidene fluoride-trifluoroethylene copolymer film, in which the piezo-electric constant in the stretching direction and the piezo-electric constant in the orthogonal direction have piezoelectric constants of different polarity from one another.

6. A polymeric piezo-electric material as in claim 4 or 5, wherein the copolymer contains from 45 mol% to 90 mol% vinylidene fluoride.

7. A process as in claim 1, wherein the copolymer contains from 45 mol% to 90 mol% vinylidene fluoride.

8. A process as in claim 1, wherein the copolymer contains from 45 mol% to 65 mol% vinylidene fluoride.

9. A process as in claim 1, 2, or 3, wherein the temperature range where a maximum dielectric constant occurs is the range from a temperature 20° C. lower than the temperature at which the maximum of the dielectric constant occurs to a temperature 10° C. higher than said temperature.

10. A process as in claim 1, 2, or 3, wherein the temperature range where a maximum dielectric constant occurs is the range from a temperature 10° C. lower than the temperature at which the maximum of the dielectric constant occurs to a temperature 10° C. higher than said temperature.

* * * * *